United States Patent
Kawahara et al.

(10) Patent No.: US 6,469,370 B1
(45) Date of Patent: Oct. 22, 2002

(54) SEMICONDUCTOR DEVICE AND METHOD OF PRODUCTION OF THE SEMICONDUCTOR DEVICE

(75) Inventors: Toshimi Kawahara; Hirohisa Matsuki; Yasuhiro Shinma; Yoshiyuki Yoneda; Norio Fukasawa; Yuzo Hamanaka; Kenichi Nagashige, all of Kawasaki; Takashi Hozumi, Kasugai, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/495,332

(22) Filed: Feb. 1, 2000

(30) Foreign Application Priority Data

Feb. 23, 1999 (JP) .......................................... 11-044919

(51) Int. Cl.[7] .............................................. H01L 23/48
(52) U.S. Cl. ...................... 257/678; 257/686; 257/723; 257/738
(58) Field of Search ................................ 257/678, 685, 257/686, 723, 737, 738, 777, 778, 780, 758; 439/68; 174/262

(56) References Cited

U.S. PATENT DOCUMENTS

| | | | | |
|---|---|---|---|---|
| 5,391,914 A | * | 2/1995 | Sullivan et al. ............. | 257/635 |
| 5,510,758 A | * | 4/1996 | Fujita et al. ................ | 257/778 |
| 5,763,939 A | * | 6/1998 | Yamashita .................. | 257/668 |
| 5,773,882 A | * | 6/1998 | Iwasaki ..................... | 257/692 |
| 5,808,873 A | * | 9/1998 | Celaya et al. ............... | 361/760 |
| 5,952,709 A | * | 9/1999 | Kitazawa et al. ........... | 257/664 |
| 5,959,356 A | * | 9/1999 | Oh ............................. | 257/738 |
| 5,962,925 A | * | 10/1999 | Eifuku et al. ............... | 257/778 |

FOREIGN PATENT DOCUMENTS

| | | |
|---|---|---|
| DE | 197 54 372 A1 | 9/1998 |
| EP | 0 853 337 A1 | 7/1998 |
| JP | 9-172036 | 6/1997 |
| WO | WO97/08748 | 3/1997 |

* cited by examiner

Primary Examiner—Jerome Jackson, Jr.
Assistant Examiner—Lourdes Cruz
(74) Attorney, Agent, or Firm—Armstrong, Westerman & Hattori, LLP

(57) ABSTRACT

In a semiconductor device of the present invention and a production method thereof, an electronic circuit is provided in a semiconductor substrate, the electronic circuit having terminals. An internal wiring pattern is provided in the substrate, the internal wiring pattern being connected to the electronic circuit terminals. A protective layer is provided on the substrate, the protective layer covering the substrate. Vias are provided on the substrate so as to project from the protective layer, the vias being connected to the internal wiring pattern at arbitrary positions on the substrate. An external wiring pattern is provided on the protective layer, the external wiring pattern being connected to the vias. Projection electrodes are connected to the external wiring pattern, the projection electrodes having a predetermined height above the external wiring pattern. An enclosure layer of a resin material is provided on the protective layer, the enclosure layer covering sides of the projection electrodes and external surfaces of the external wiring pattern.

19 Claims, 12 Drawing Sheets

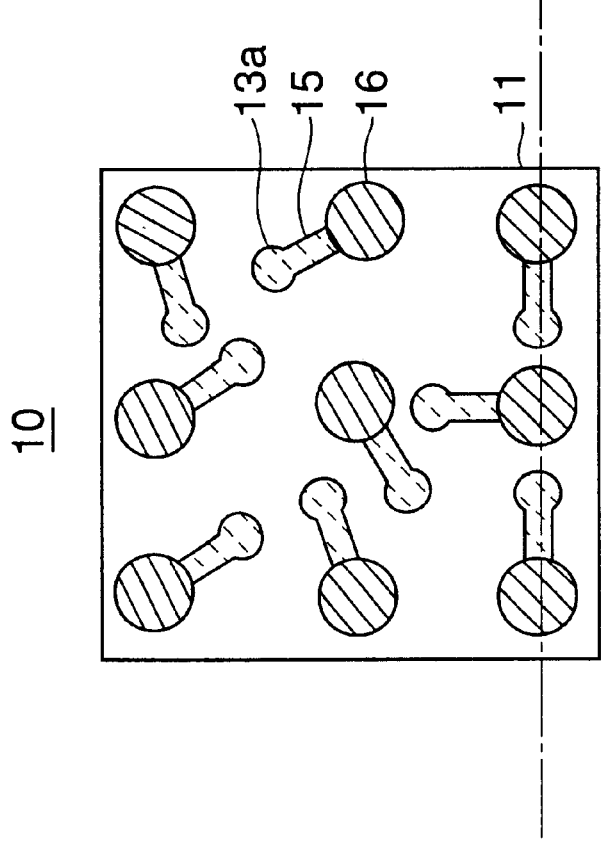
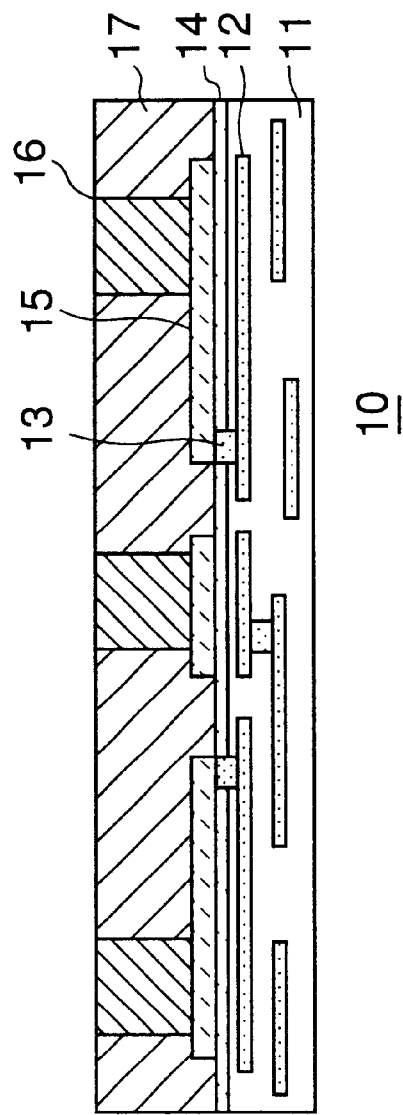
FIG. 1A
FIG. 1B

SEMICONDUCTOR DEVICE AND METHOD OF PRODUCTION OF THE SEMICONDUCTOR DEVICE

BACKGROUND OF THE INVENTION

1. Field of the Invention

The present invention generally relates to a semiconductor device and a method of production of the semiconductor device, and more particularly to a semiconductor device having a chip size package (CSP) structure and a method of production thereof.

In order to conform the shape and size of semiconductor devices to the chip shape and size as closely as possible, there has been proposed the CSP structure of semiconductor devices in which external output terminals are provided on the semiconductor device and enclosed in a resin material.

2. Description of the Related Art

A description will now be given of a conventional CSP semiconductor device with reference to FIG. 11, FIG. 12 and FIG. 13. FIG. 11 shows the conventional CSP semiconductor device 1100. FIG. 12 is a cross-sectional view of the conventional CSP semiconductor device 1100 taken along the one-dot chain line indicated in FIG. 11. FIG. 13 shows interconnections of the elements in the conventional CSP semiconductor device 1100.

As shown in FIG. 12, in the conventional CSP semiconductor device 1100, a semiconductor substrate 1101, an internal wiring pattern 1102, vias 1103, a protective layer 1104, an external wiring pattern 1105, and projection electrodes 1106 are provided. The substrate 1101 contains an electronic circuit provided therein, and the electronic circuit includes terminals. The internal wiring pattern 1102 is provided in the substrate 1101 and connected to the electronic circuit terminals. The vias 1103 are made of aluminum (Al) and they are electrically conductive. The vias 1103 are connected to the internal wiring pattern 1102. The vias 1103 are provided in the substrate 1101 and project from the protective layer 1104. The protective layer 1104 is made of a resin material, such as polyimide, that is dielectric, and provided on the substrate 1101. The external wiring pattern 1105 is made of copper (Cu) and connected to the vias 1103 which project from the protective layer 1104. The projection electrodes 1106 are provided on the external wiring pattern 1105.

In the above-described semiconductor device 1100 of FIG. 13, the protective layer 1104 is omitted for the sake of convenience and the interconnections of the elements 1103, 1105, 1106 and 1108 are shown.

At the final stage of the packaging, the semiconductor device 1100 is enclosed in an enclosure of a resin material, but only the upper edges of the projection electrodes 1106 are not covered with the enclosure. The enclosure of the conventional CSP chip is not illustrated in FIG. 12.

In the above-described semiconductor device of FIG. 13, the positions of the projection electrodes 1106 on the chip are determined in a fixed manner by using the reflow of the solder of the external wiring pattern 1105. The reflow of the solder of the external wiring pattern 1105 allows electrical connections between the pads 1108 and the projection electrodes 1106. As the pitch of the projection electrodes 1106 can be larger than the pad pitch by the reflow of the solder of the external wiring pattern 1105, it is possible to avoid the short-circuit of the projection electrodes 1106 when implementing the above-described semiconductor device on a main printed wiring board.

However, the pads 1108 are, as shown in FIG. 13, provided at peripheral portions on the chip surface. These pads are essentially the same as those used with existing wire bonding equipment. Each of the pads 1108 is, typically, in the size of 100 $\mu$m×100 $\mu$m, and the arrangement of the pads 1108 at the peripheral portions of the semiconductor chip will be detrimental to increasing the packaging density of the semiconductor device. The total number of transistors that can be mounted on the conventional CSP semiconductor device will be significantly restricted due to the size of the pads.

In the above-described semiconductor device 1100, the external wiring pattern 1105 does not connect the pads 1108 and the projection electrodes 1106 by the shortest distance. Some of the external wiring pattern 1105 must be elongated to connect the peripheral pads 1108 and the projection electrodes 1106, and this will degrade the electrical performance of the connections in the conventional CSP semiconductor device.

SUMMARY OF THE INVENTION

In order to overcome the problems described above, preferred embodiments of the present invention provide an improved semiconductor device that achieves a high packaging density of transistors on the semiconductor device as well as downsizing of the semiconductor device without degrading the electrical performance of the connections.

According to one preferred embodiment of the present invention, a semiconductor device includes: a semiconductor substrate; an electronic circuit which is provided in the substrate, the electronic circuit having terminals; an internal wiring pattern which is provided in the substrate, the internal wiring pattern being connected to the electronic circuit terminals; a protective layer which is provided on the substrate, the protective layer covering the substrate; vias which are provided on the substrate so as to project from the protective layer, the vias being connected to the internal wiring pattern at arbitrary positions on the substrate; an external wiring pattern which is provided on the protective layer, the external wiring pattern being connected to the vias; projection electrodes which are provided on the external wiring pattern, the projection electrodes being connected to the external wiring pattern to establish connections between the projection electrodes and the electronic circuit terminals, the projection electrodes having a predetermined height above the external wiring pattern; and an enclosure layer of a resin material which is provided on the protective layer, the enclosure layer covering sides of the projection electrodes and external surfaces of the external wiring pattern.

The semiconductor device of the preferred embodiment does not require the pads provided in the conventional CSP semiconductor device. In the semiconductor device of the preferred embodiment, the projection electrodes are connected to the external wiring pattern to establish connections between the projection electrodes and the electronic circuit terminals. The external wiring pattern connects the vias and the projection electrodes by the shortest distance. The semiconductor device of the present invention is effective in achieving downsizing of the semiconductor device as well as increasing the packaging density of transistors on the semiconductor device. As the connections between the projection electrodes and the electronic circuit terminals can be made by the shortest distance, the semiconductor device of the preferred embodiment is effective in maintaining the electrical performance of the connections at an appropriate level.

In another preferred embodiment of the semiconductor device of the invention, a semiconductor device includes: a semiconductor substrate; an electronic circuit which is provided in the substrate, the electronic circuit having terminals; an internal wiring pattern which is provided in the substrate, the internal wiring pattern being connected to the electronic circuit terminals; a protective layer provided on the substrate, the protective layer covering the substrate; vias which are provided on the substrate and projecting from the protective layer, the vias being connected to the internal wiring pattern at arbitrary positions on the substrate; an external wiring pattern which is provided on the protective layer, the external wiring pattern being connected to the vias; lead wires which are connected to the external wiring pattern, the lead wires being supported by a tape; and an enclosure layer of a resin material which is provided on the protective layer, the enclosure layer covering portions of the lead wires and external surfaces of the external wiring pattern.

The semiconductor device of the above preferred embodiment of the invention is effective in downsizing of the semiconductor device as well as increasing the packaging density of transistors on the semiconductor device. The semiconductor device of the above preferred embodiment is effective in maintaining the electrical performance of the connections at an appropriate level.

In one preferred embodiment of the production method of the semiconductor device of the invention, the production method includes the steps of: providing an electronic circuit in a semiconductor substrate, the electronic circuit including an input transistor and an output transistor, the input transistor having an input terminal, the output transistor having an output terminal; providing an internal wiring pattern in the substrate, the internal wiring pattern being connected to the input terminal or the output terminal; providing a protective layer on the substrate, the protective layer covering the substrate; providing vias at arbitrary positions on the substrate, the vias projecting from the protective layer and being connected to the internal wiring pattern; providing an external wiring pattern on the protective layer, the external wiring pattern being connected to the vias; providing projection electrodes on the external wiring pattern, the projection electrodes being connected to the external wiring pattern to establish connections between the projection electrodes and the electronic circuit terminals, and the projection electrodes having a predetermined height above the external wiring pattern; and providing an enclosure layer of a resin material on the protective layer by using a compression molding method, the enclosure layer covering sides of the projection electrodes and external surfaces of the external wiring pattern.

The production method of the semiconductor device of the above preferred embodiment of the invention is effective in downsizing of the semiconductor device as well as increasing the packaging density of transistors on the semiconductor device. As the connections between the projection electrodes and the electronic circuit terminals can be made by the shortest distance, the production method of the above preferred embodiment is effective in maintaining the electrical performance of the connections at an appropriate level.

BRIEF DESCRIPTION OF THE DRAWINGS

Other objects, features and advantages of the present invention will become apparent from the following detailed description when read in conjunction with the accompanying drawings in which:

FIG. 1A and FIG. 1B are views of a first preferred embodiment of the semiconductor device according to the invention;

DETAILED DESCRIPTION OF PREFERRED EMBODIMENTS

Figure 2A:
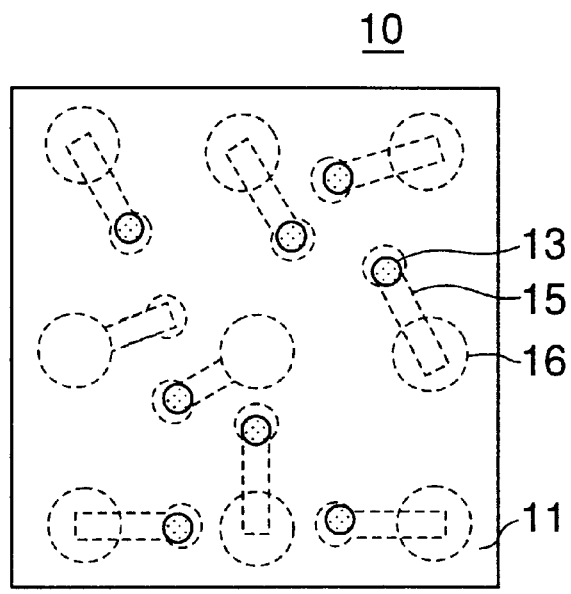
FIG. 2A and FIG. 2B are diagrams for explaining differences between the first preferred embodiment of the invention and a conventional semiconductor device.

A description will now be provided of preferred embodiments of the present invention with reference to the accompanying drawings.

FIG. 1A and FIG. 1B show a first preferred embodiment of the semiconductor device according to the invention. FIG. 1A is a top view of the first preferred embodiment of the semiconductor device. FIG. 1B is a cross-sectional view of the first preferred embodiment of the semiconductor device taken along the one-dot chain line in FIG. 1A.

The semiconductor device 10 of the present embodiment has the CSP structure, as shown in FIG. 1A and FIG. 1B. In the semiconductor chip 10 of this embodiment, a semiconductor substrate 11, which contains an electronic circuit therein, is provided. The electronic circuit contained in the substrate 11 includes an input transistor and an output transistor, the input transistor having an input terminal, and the output transistor having an output terminal.

An internal wiring pattern 12 is provided in the substrate 11, and the internal wiring pattern 12 is connected to the electronic circuit terminals. A protective layer 14 is provided on the substrate 11, and the protective layer 14 covers the substrate 11. A plurality of vias 13 is provided on the substrate 11 and project from the protective layer 14. The vias 13 are connected to the internal wiring pattern 12 at arbitrary positions on the substrate 11. The vias 13 are connected through the internal wiring pattern 12 to the input or output terminal of the electronic circuit contained in the substrate 11.

An external wiring pattern 15 is provided on the protective layer 14, and the external wiring pattern 15 is connected to the vias 13. A plurality of projection electrodes 16 are provided on the external wiring pattern 15 and connected to the external wiring pattern 15 to establish connections between the projection electrodes 16 and the electronic circuit terminals. The projection electrodes 16 have a predetermined height above the external wiring pattern 15.

In the semiconductor device 10 of the present embodiment, an enclosure layer 17 of a resin material is provided on the protective layer 14, and the enclosure layer 17 covers the sides of the projection electrodes 16 and the external surfaces of the external wiring pattern 15. Only the top surfaces of the projection electrodes 16 are not covered with the enclosure layer 17.

As shown in FIG. 1A and FIG. 1B, in the semiconductor device 10 of the present embodiment, the vias 13 are connected to the external wiring pattern 15 at arbitrary positions on the substrate 11. In FIG. 1A, reference numeral 13a denotes one of the connecting portions between the vias 13 and the external wiring pattern 15. As shown in FIG. 1A, a portion of the external wiring pattern 15 extends from the connecting portion 13a to the projection electrode 16. The projection electrode 16 is provided on the external wiring pattern 15 at the end of that portion.

Figure 13:
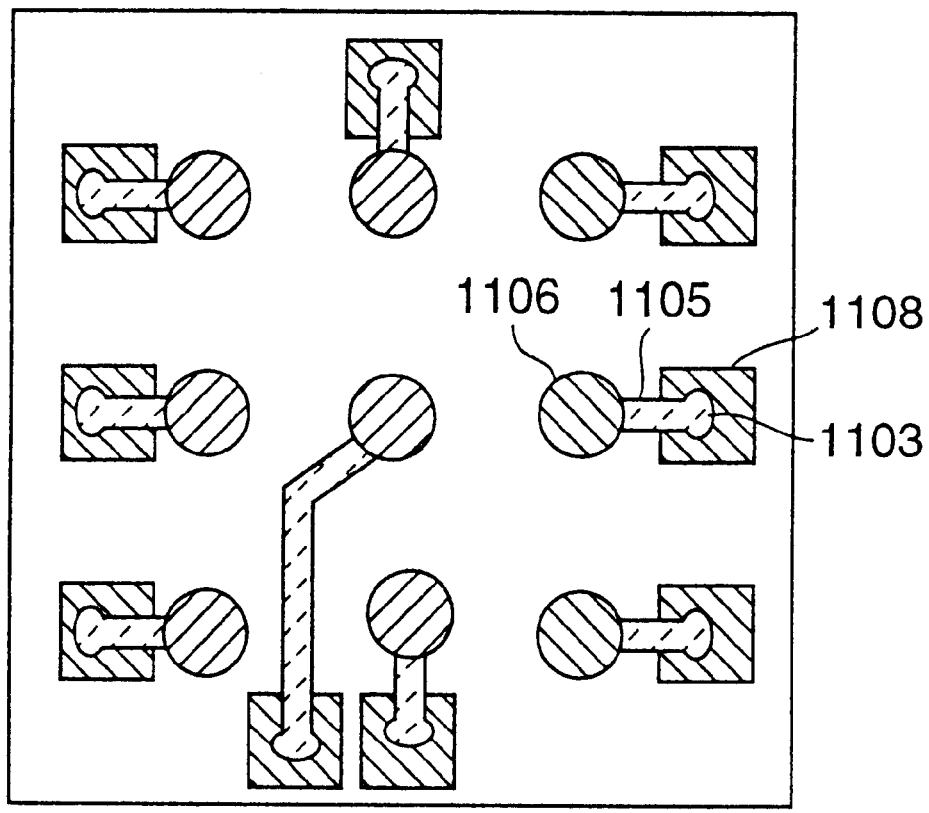
FIG. 13 is a diagram showing interconnections of the elements in the conventional CSP semiconductor device of FIG. 11.

In the conventional CSP semiconductor device of FIG. 13, the electronic circuit terminals are connected to the pads 1108, and the pads 1108 are connected to the projection electrodes 1106 by arranging the external wiring pattern 1105. That is, the external wiring pattern 1105 is routed from the pads 1108 to the projection electrodes 1106. Hence, the external wiring pattern 1105 does not connect the vias 1103 and the projection electrodes 1106 by the shortest distance.

The semiconductor device 10 of the present embodiment does not require the pads provided in the conventional CSP semiconductor device. In the semiconductor device 10 of the present embodiment, the projection electrodes 16 are connected to the external wiring pattern 15 to establish connections between the projection electrodes 16 and the electronic circuit terminals. The external wiring pattern 15 connects the vias 13 and the projection electrodes 16 by the shortest distance. Therefore, the semiconductor device 10 of the present embodiment is effective in achieving downsizing of the semiconductor device as well as increasing the packaging density of the transistors on the semiconductor device. As the connections between the projection electrodes 16 and the electronic circuit terminals can be made by the shortest distance, the semiconductor device 10 of the present embodiment is effective in increasing the electrical performance of the connections.

In the semiconductor device 10 of the present embodiment, the vias 13 are made of aluminum and have a diameter in the range from 5 $\mu$m to 25 $\mu$m and a height in the range from 10 $\mu$m to 50 $\mu$m from the internal wiring pattern 12. As shown in FIG. 1B, the vias 13 are connected to the internal wiring pattern 12 in the substrate 11. The internal wiring pattern 12 is made of aluminum and connected to the electronic circuit terminals in the substrate 11. In the example of FIG. 1B, the internal wiring pattern 12 connects the electronic circuit terminals and the vias 13. However, the above-described embodiment may be modified. If any portion of the electronic circuit contained in the substrate 11 does not exist just below the vias 13, the vias 13 may be provided at arbitrary positions that are connected to the electronic circuit terminals by the internal wiring pattern 12. The external wiring pattern 15 is provided on the protective layer 14, the external wiring pattern 15 having a portion located above each of the vias 13, and the external wiring pattern 15 being connected to the vias 13 at such portions. By this modification of the semiconductor device of the present embodiment, it is possible to maintain the electrical performance of the connections without the degradation and to eliminate the parasitic capacitance or the parasitic inductance produced in the electronic circuit of the substrate 11.

In the example of FIG. 1B, the upper layer of the internal wiring pattern 12 is connected to the vias 13. However, the present invention is not limited to this example, and it is possible to connect the lower layer of the internal wiring pattern 12 to the vias 13.

In the semiconductor device 10 of the present embodiment, the vias 13 serve to connect the internal wiring pattern 12 and the external wiring pattern 15. It is not necessary that the material of the vias 13 is the same as the material of the wiring patterns 12 and 15, and the material of the vias 13 may be different from that of the wiring patterns 12 and 15. The external wiring pattern 15 in the present embodiment is made of a copper material having a width of 25 $\mu$m. The external wiring pattern 15 is provided on the protective layer 14. The material of the external wiring pattern 15 is not limited to copper, and gold or nickel may be used instead as the material of the external wiring pattern 15.

In the semiconductor device 10 of the present embodiment, the external wiring pattern 15 serves to rearrange the connections from the connecting portions 13a to the projection electrodes 16 after the chip production processes are finished. In the conventional CSP semiconductor device, the external wiring pattern is routed from the pads at the peripheral portions to the projection electrodes. As described above, according to the present embodiment, the vias 13 can be provided at arbitrary positions on the substrate 11, and the connections between the projection electrodes 16 and the electronic circuit terminals can be made by the shortest distance. The semiconductor device 10 of the present embodiment is effective in achieving downsizing of the semiconductor device as well as increasing of the packaging density of transistors on the semiconductor device. The semiconductor device 10 of the present embodiment is more effective in increasing the electrical performance of the connections when compared to the conventional CSP semiconductor device.

Figure 2B:
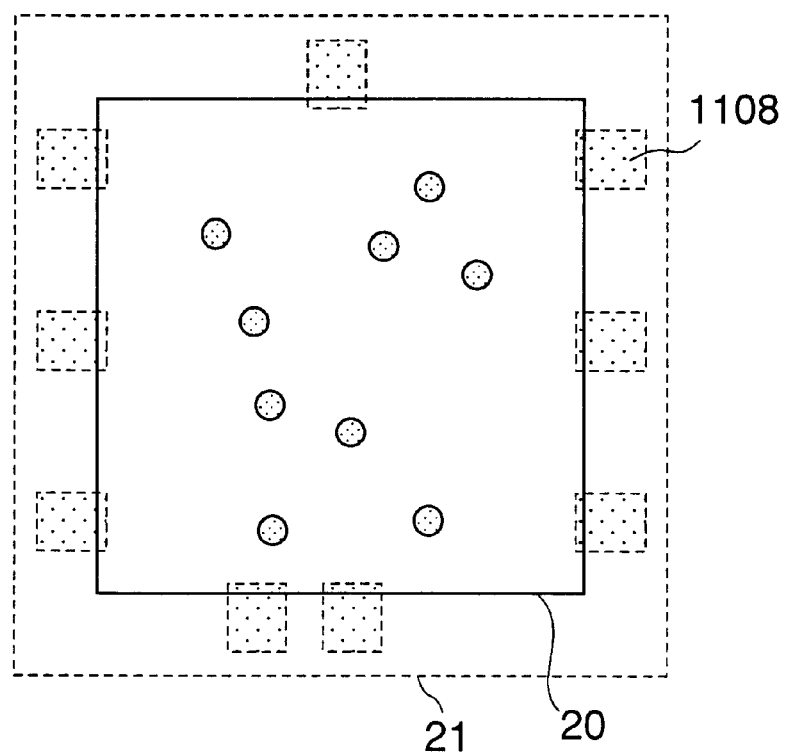

FIG. 2A and FIG. 2B show differences between the semiconductor device 10 of the first preferred embodiment of the invention and a conventional CSP semiconductor device 20.

As shown in FIG. 2A, the vias 13, connected to the external wiring pattern 15 in the semiconductor device 10, have a diameter at the connecting portion 13a that is equal to or smaller than a width of the external wiring pattern 15. The vias 13 on the external surface of the semiconductor device 10 are equivalent in size to those connected to the internal wiring pattern 12 contained in the substrate 11. This helps achieve the downsizing of the semiconductor device 10 of the present embodiment. The connecting portions 13a of the vias 13 are slightly larger in width than the external wiring pattern 15. However, the connecting portions 13a can be adjusted to correct any misalignment of the external wiring pattern 15, and these do not cause the size of the semiconductor device to significantly Increase .

As shown in FIG. 2B, the semiconductor chip 21 in which the conventional CSP semiconductor device 20 is contained with the pads 1108 at the peripheral portions is larger in size than the substrate 11 of the semiconductor device 10 of the present embodiment. The areas that are occupied by the pads 1108 in the semiconductor chip 21 are significantly detrimental to achieving downsizing of the semiconductor device.

As shown in FIG. 2A, in the semiconductor device 10 of the present embodiment, the projection electrodes 16 are provided on the external wiring pattern 15 at the predetermined end portions of the external wiring pattern 15. The end portions of the external wiring pattern 15 are shaped in conformity with the positions of the individual projection electrodes 16.

In the semiconductor device 10 of the present embodiment, the projection electrodes 16 are formed on the external wiring pattern 15 by plating of copper. The projection electrodes 15 have a diameter of 300 $\mu$m and a height of 100 $\mu$m from the external wiring pattern 15. The arrangement of the projection electrodes 16 is made in conformity with the arrangement of the external terminals of the main printed wiring board on which the semiconductor device 10 is implemented. The enclosure layer 17 of the resin material is provided on the substrate 11 and covers the sides of the projection electrodes 16 and the external surfaces of the external wiring pattern 15. Only the top surfaces of the projection electrodes 16 are not covered with the enclosure layer 17. In the present embodiment, the enclosure layer 17 of the resin material is formed on the substrate 11 by using a compression molding method, which will be explained below.

Figure 3:
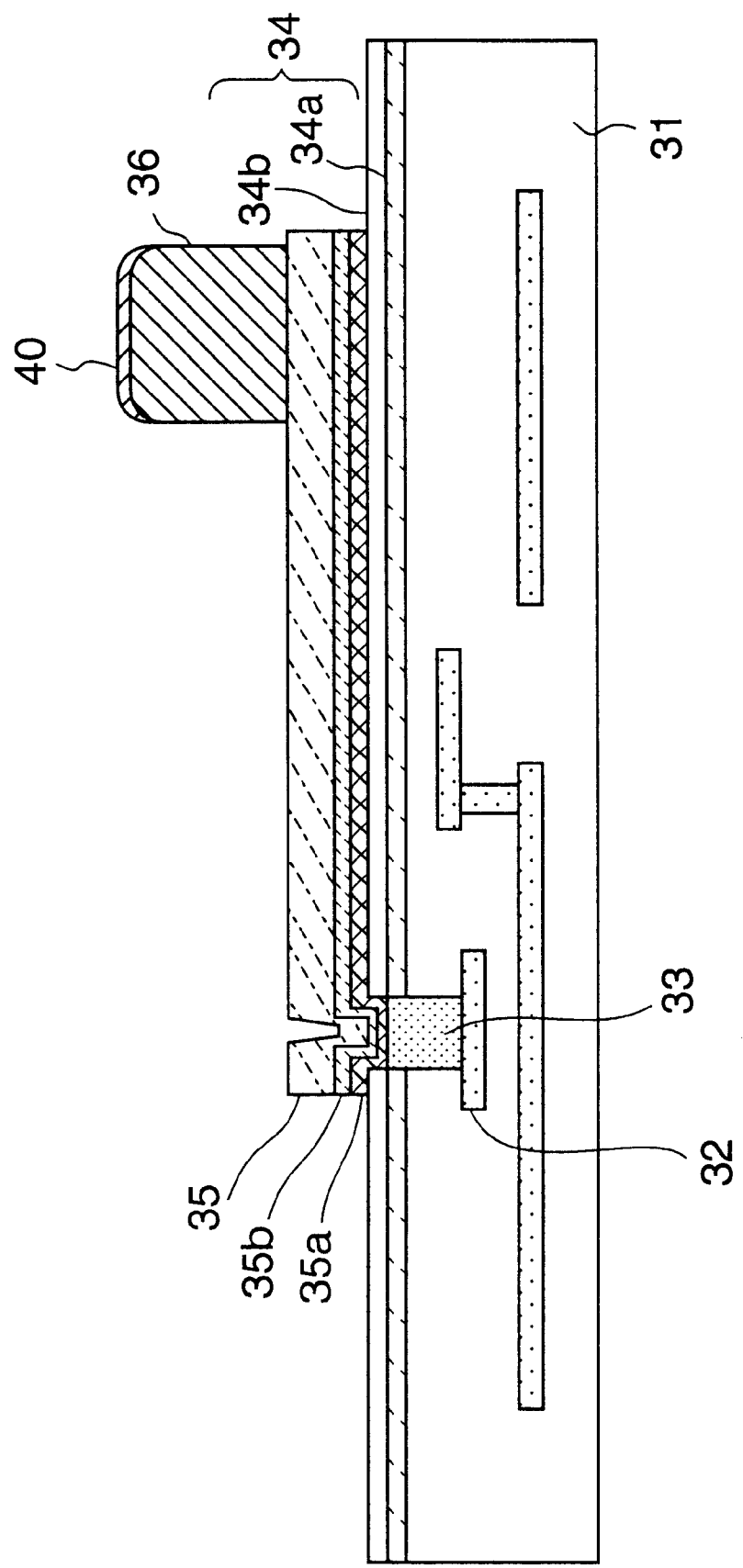
FIG. 3 is a diagram for explaining a method of production of the first preferred embodiment of the semiconductor device according to the invention.

Next, a description will be provided of a method of production of the semiconductor device of the first preferred embodiment with reference to FIG. 3.

As shown in FIG. 3, a PSG/SiN layer 34a with a thickness of 1 $\mu$m is formed on a semiconductor substrate 31 by sputtering, and a cover layer 34b of a polyimide resin with a thickness of 10 $\mu$m is further formed on the PSG/SiN layer 34a of the substrate 31 by sputtering. A protective layer 34 is constituted by the PSG/SiN layer 34a and the cover layer 34b. The substrate 31 contains an electronic circuit (not shown) and an internal wiring pattern 32.

An opening which has a depth to reach the level of the internal wiring pattern 32 is formed in the substrate 31 at a position corresponding to a via 33 by etching. Then, the opening in the substrate 31 is filled with aluminum by using the lift-off method so that the via 33 is formed.

After the via 33 is formed, a contact metal layer 35a, made of chromium, with a thickness of 1 $\mu$m is formed on the entire surface of the substrate 31 by sputtering. Further, a wiring base metal layer 35b, made of copper, with a thickness of 2 $\mu$m is formed on the contact metal layer 35a by sputtering.

After the wiring base metal layer 35b is formed, an external wiring pattern 35 is formed on the wiring base metal layer 35b as follows. Portions of the wiring base metal layer 35b where the external wiring pattern 35 is not provided are covered with a wire-forming resist (not shown), and the external wiring pattern 35, made of copper, with a thickness of 5 $\mu$m is formed on the wiring base metal layer 35b by electroplating.

After the external wiring pattern 35 is formed, portions of the external wiring pattern 35 where a projection electrode 36 is not provided are covered with an electrode-forming resist (not shown), and the projection electrode 36 made of copper with a thickness of 100 $\mu$m is formed on the external wiring pattern 35 by electroplating. Further, in order to provide the projection electrode 36 with corrosion resistance, a protective metal layer 40 made of nickel, gold or palladium is formed on the top surface of the projection electrode 36.

After the electrode-forming resist is removed, etching is performed by using the external wiring pattern 35 as the mask. Unmasked portions of the contact metal layer 35a and the wiring base metal layer 35b are removed by this etching, as shown in FIG. 3. This etching may result in slight decreases in the thickness of the external wiring pattern 35 and the protective metal layer 40. It should be noted that it is necessary to ensure that adequately-large thicknesses are created when the external wiring pattern 35 and the protective metal layer 40 are formed, and that adequate thicknesses remain even if both have been decreased by the above etching.

In the production method of the present embodiment, after the projection electrode 36 is formed, the enclosure layer 17 (not shown in FIG. 3) is formed on the substrate 11 by using a compression molding method, which will now be described below.

The compression molding method mentioned above uses upper and lower molding dies, which form a cavity in a given configuration. A wafer on which the intermediate semiconductor devices (each of which includes the projection electrodes 36 formed but the enclosure layer is not yet formed) are produced is placed into the cavity between the upper and lower molding dies. Tablets of a thermosetting resin, such as PPS, PEEK or PES, are placed above the middle of the wafer. It is necessary, at this time, to prevent the resin from sticking to the upper and lower molding dies. It is possible to prevent the sticking of the resin by applying a protective film to the upper and lower molding dies.

In the compression molding method, after the resin tablets are placed into the cavity between the upper and lower molding dies, the upper and lower molding dies, which contain the wafer placed therein, are heated to a temperature that is above the melting point of the resin. While the molds are being heated, one of the molding dies is pressed to the other so that the resin tablets on the wafer are subjected to the heat and compression. The resin, which is softened due to the heat, is spread over the entire surface of the wafer under the compressed condition. In each semiconductor device, the enclosure layer 17 of the resin material is formed on the substrate 31 such that the enclosure layer 17 covers the sides of the projection electrodes 36 and the external surfaces of the external wiring pattern 35.

In the above-described embodiment, the compression molding method is carried out for the wafer. Alternatively, the compression molding method may be used for the individual semiconductor chips, which are produced by cutting the wafer into pieces.

The details of the above-mentioned compression molding method are explained, for example, in Japanese Patent Application No.9-10683, filed on Jan. 23, 1997, which corresponds to U.S. patent application Ser. No. 029,608 and was assigned to the applicant of the present invention. The disclosure of the above-mentioned prior application concerning the compression molding method is hereby incorporated by reference.

The production method of the present embodiment uses the enclosure layer 17 made of a compression-molded resin, which is formed on the protection layer 14 according to the above-mentioned compression molding method. It is not necessary that the resin contains a mold lubricant as required by the enclosure layer of a conventional semiconductor device. Because of the lack of a mold lubricant in the resin of the enclosure layer 17, it is possible for the semiconductor device of the present embodiment to cover the sides of the projection electrodes 16 and the external surfaces of the wiring pattern 15 without reducing the adhesion of the resin used by the enclosure layer 17.

After the enclosure layer 17 is formed on the protective layer 14 according to the compression molding method, a thin resin layer may be present on the top surfaces of the projection electrodes 16. The thin resin layer can easily be removed from the top of the projection electrodes 16 by using an etching process, a polishing process, a sand-blasting process or an ultraviolet (UV) radiation.

Alternatively, a flexible film of a suitable material may be applied to the upper mold for the enclosure layer 17 before performing the compression molding. After the flexible film is applied, the projection electrodes 16 penetrate the flexible film when the compression molding is performed, and after the compression molding is done, the flexible film is removed. By using the flexible film in this manner, it is possible to prevent the formation of a thin resin layer on the top surfaces of the projection electrodes 16.

Figure 4:
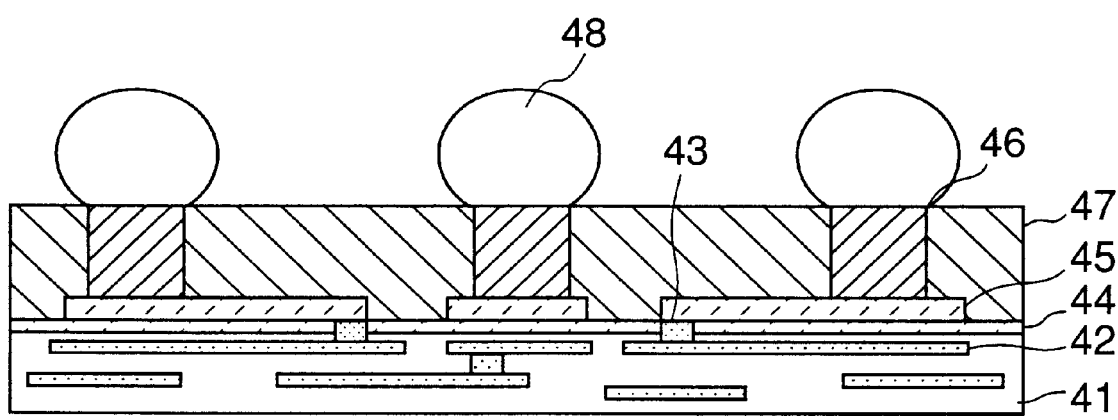
FIG. 4 is a diagram showing the first preferred embodiment of the semiconductor device to which bumps are attached.

FIG. 4 shows the first preferred embodiment of the semiconductor device to which solder bumps are attached.

As described above, in the semiconductor device 10 of the present embodiment, only the top surfaces of the projection electrodes are not covered with the enclosure layer of the resin material. In the semiconductor device 10 of FIG. 4, bumps 48 are formed on the top surfaces of the projection electrodes 46.

As shown in FIG. 4, in the semiconductor device 10 of the present embodiment, a semiconductor substrate 41, which contains an electronic circuit therein, is provided. The electronic circuit contained in the substrate 41 includes an input transistor and an output transistor, the input transistor having an input terminal, and the output transistor having an output terminal.

An internal wiring pattern 42 is provided in the substrate 41, and the internal wiring pattern 42 is connected to the electronic circuit terminals. A protective layer 44 is provided on the substrate 41, and the protective layer 44 covers the substrate 41. A plurality of vias 43 is provided on the substrate 41 and project from the protective layer 44. The vias 43 are connected to the internal wiring pattern 42 at arbitrary positions on the substrate 41. The vias 43 are connected through the internal wiring pattern 42 to the input or output terminal of the electronic circuit contained in the substrate 41.

An external wiring pattern 45 is provided on the protective layer 44, and the external wiring pattern 45 is connected to the vias 43. A plurality of projection electrodes 46 is provided on the external wiring pattern 45 and connected to the external wiring pattern 45 to establish connections between the projection electrodes 46 and the electronic circuit terminals. The projection electrodes 46 have a predetermined height above the external wiring pattern 44.

In the semiconductor device 10 of the present embodiment, an enclosure layer 47 of a resin material is provided on the protective layer 44, and the enclosure layer 47 covers the sides of the projection electrodes 46 and the external surfaces of the external wiring pattern 45. Only the top surfaces of the projection electrodes 46 are not covered with the enclosure layer 47. The bumps 48 are provided on the top surfaces of the projection electrodes 46.

There are several known methods to form the bumps 48 on the top surfaces of the projection electrodes 46. For example, a transfer bump forming method or a screen-printing method using a stencil mask may be used to form the bumps 48 on the top surfaces of the projection electrodes 46 in the semiconductor device 10 of the present embodiment. A typical material for the bumps 48 is a tin-lead alloy. The composition ratio of this alloy is changed in accordance with the desired characteristics of the bumps 48.

It is possible to implement the semiconductor device 10 on the main printed wiring board without using the bumps 48. However, the semiconductor device 10 of FIG. 4 that employs the bumps 48 formed on the projection electrodes 46 does not require any soldering on the main printed wiring board before implementing the semiconductor device 10. The semiconductor device 10 of the present embodiment will increase the ease of the implementation onto the main printed wiring board.

After the forming of the bumps 48 is performed, a wafer in which each of the semiconductor devices includes the external wiring pattern 45 and the projection electrodes 46 being formed on the substrate 41 and further the bumps 48 being formed on the projection electrodes 46 is produced. In each semiconductor device of the wafer, the enclosure layer of the resin material is formed on the substrate by using the compression molding method.

Figure 5:
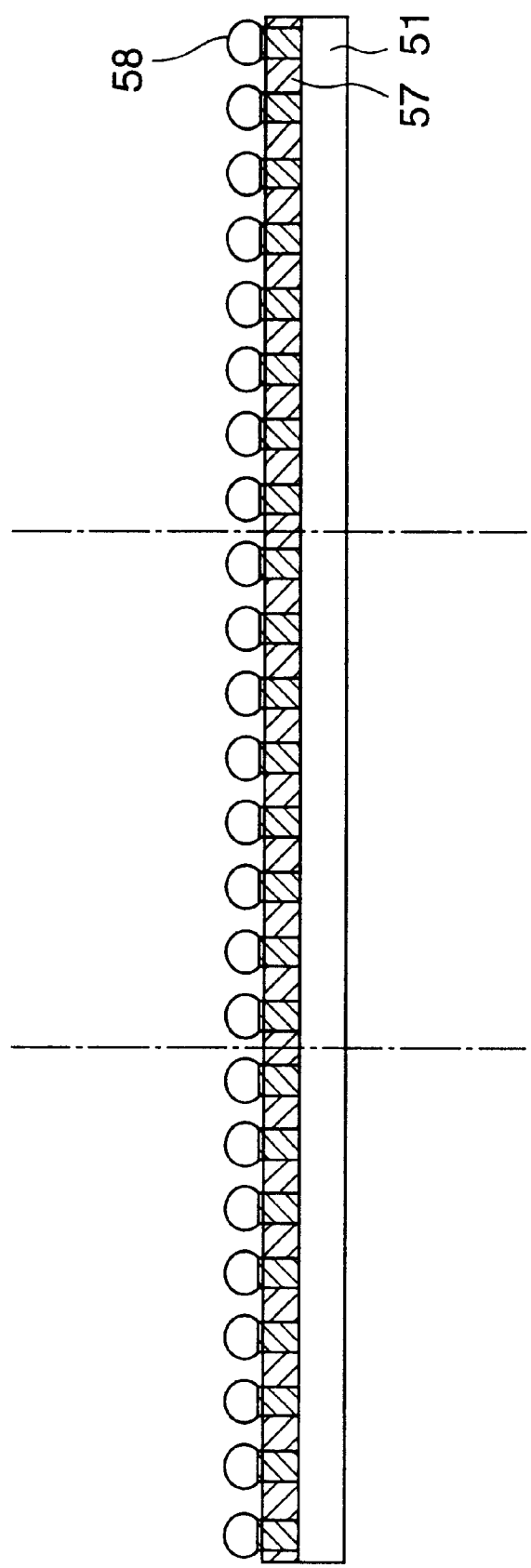
FIG. 5 is a diagram showing a wafer condition of the first preferred embodiment of the semiconductor device.

FIG. 5 shows a wafer condition of the first preferred embodiment of the semiconductor device before the wafer is cut into a number of chips. As shown in FIG. 5, the enclosure layer 57 of the resin material is formed on the entire surface of the substrate 51 of the wafer, and the bumps 58 are formed on the projection electrodes of the respective semiconductor devices. In FIG. 5, a detailed configuration of the elements in each semiconductor device of the wafer is essentially the same as that of the semiconductor device 10 in FIG. 4, and a description thereof will be omitted.

Finally, by using a dicing saw, the above-described wafer is cut into a number of pieces, as indicated by the one-dot chain lines in FIG. 5, and each of the resultant pieces constitutes the semiconductor device 10 of the present embodiment. Therefore, in the semiconductor device 10 of the present embodiment, as shown in FIG. 4, the enclosure layer 47 includes a first side surface and the substrate 41 includes a second side surface, the first side surface and the second side surface being formed as a common plane produced by the dicing saw.

Accordingly, the semiconductor device of the present embodiment is effective in achieving downsizing of the semiconductor device as well as increasing of the packaging density of the transistors on the semiconductor device.

In the semiconductor device of the present embodiment shown in FIG. 1A and FIG. 2A, the vias 13 are connected to the external wiring pattern 15 at arbitrary positions on the substrate 11, and the connections between the projection electrodes 16 and the electronic circuit terminals are made shortest. The external wiring pattern 15 connects the vias 13 and the projection electrodes 16 by the shortest distance. Further, the enclosure layer 17 of the resin material is formed on the substrate 11 by using the compression molding method. As the length of the external wiring pattern 15 is minimized, the flowing property of the resin during the compression molding can be significantly improved and the inclusion of voids in the enclosure layer 17 can be positively prevented.

Further, in the semiconductor device of the present embodiment, an input signal can be directly supplied to the electronic circuit in the substrate 11 through the projection electrodes 16, and an output signal from the electronic circuit in response can be detected through the projection electrodes 16. According to the present invention, the production method of the semiconductor device of the present embodiment further includes, after the enclosure layer 17 is formed on the substrate 11 by using the compression molding method, a step of connecting a testing probe to the projection electrodes 16 in order to test the electronic circuit contained in the substrate 11. In this testing step, an input signal is supplied from the testing probe to the electronic circuit of the substrate 11 through the projection electrodes 16, and an output signal from the electronic circuit in response can be detected by using the testing probe that is connected to the projection electrodes 16.

Generally, the conventional semiconductor devices have a difficulty in testing the packaged semiconductor chip. However, the semiconductor device of the present embodiment is very convenient for the purpose of testing, which is performed following the packaging. Further, the semiconductor device of the present embodiment is substantially in a condition of being a final product, and this makes it possible to facilitate the testing processes for semiconductor devices in the final-product condition by utilizing the semiconductor device of the present embodiment.

Figure 6A:
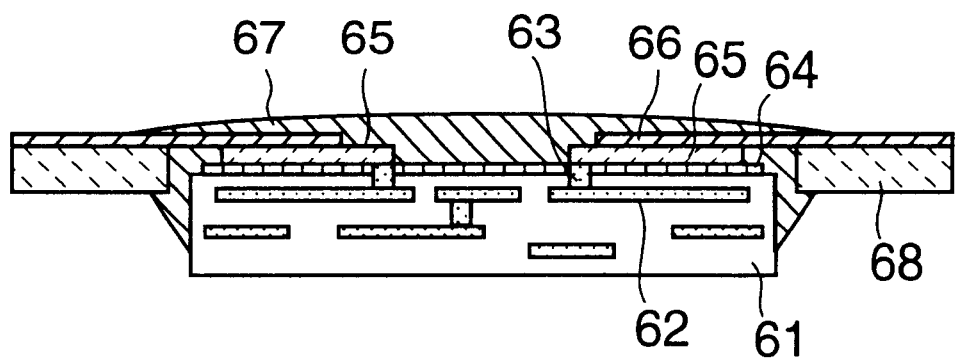
FIG. 6A and FIG. 6B are cross-sectional views of a second preferred embodiment of the semiconductor device according to the invention.
Figure 6B:
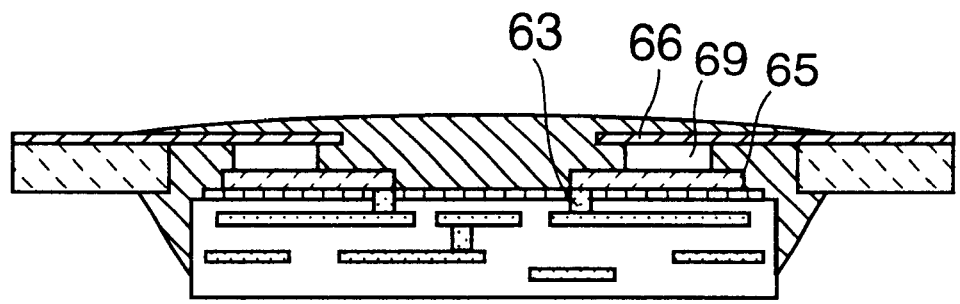

FIG. 6A and FIG. 6B show a second preferred embodiment of the semiconductor device according to the invention. In the semiconductor device of the present embodiment, lead wires, supported by a tape, are used instead of the projection electrodes 16 in the first preferred embodiment of FIG. 1A and FIG. 1B.

As shown in FIG. 6A, the semiconductor device of the present embodiment includes a semiconductor substrate 61. An electronic circuit is provided in the substrate 61, the electronic circuit having terminals. An internal wiring pattern 62 is provided in the substrate 61, the internal wiring pattern 62 being connected to the electronic circuit terminals. A protective layer 64 is provided on the substrate 61, the protective layer 64 covering the substrate 61. A plurality of vias 63 is provided on the substrate 61, and the vias 63 project from the protective layer 64. The vias 63 are connected to the internal wiring pattern 62 at arbitrary positions on the substrate 61. An external wiring pattern 65 is provided on the protective layer 64, the external wiring pattern 65 being connected to the vias 63. A plurality of lead wires 66, which is supported by a tape 68, is connected to the external wiring pattern 65. An enclosure layer 67 of a resin material is provided on the protective layer 64, the enclosure layer 67 covering portions of the lead wires 66 and external surfaces of the external wiring pattern 65.

In the above-described embodiment, the lead wires 66 are used, instead of the projection electrodes 16, in order to connect the electronic circuit, contained in the semiconductor device, to an external device. The semiconductor device of the present embodiment is effective in reducing the lead wire pitch to a relatively small level of about 30 μm.

The semiconductor device of FIG. 6B is essentially the same as the semiconductor device of FIG. 6A, but differs from the embodiment of FIG. 6A in that a connecting layer 69 of a different conductive material, such as gold (Au), is further provided between the external wiring pattern 65 and the lead wires 66. The semiconductor device of the present embodiment, which includes the connecting layer 69, is effective in preventing the short-circuit of the lead wires 66 on the external wiring pattern 65 and in reducing the stress at the interconnections between the lead wires 66 and the external wiring pattern 65.

Figure 7A:
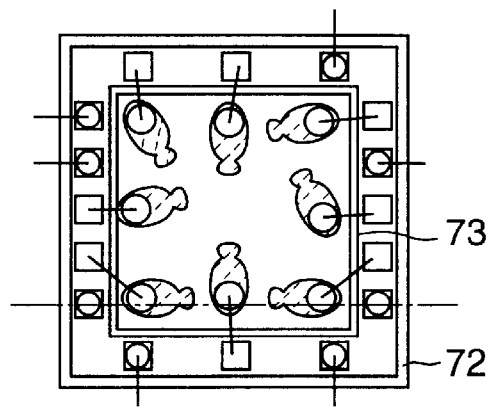
FIG. 7A and FIG. 7B are views of a third preferred embodiment of the semiconductor device according to the invention.
Figure 7B:
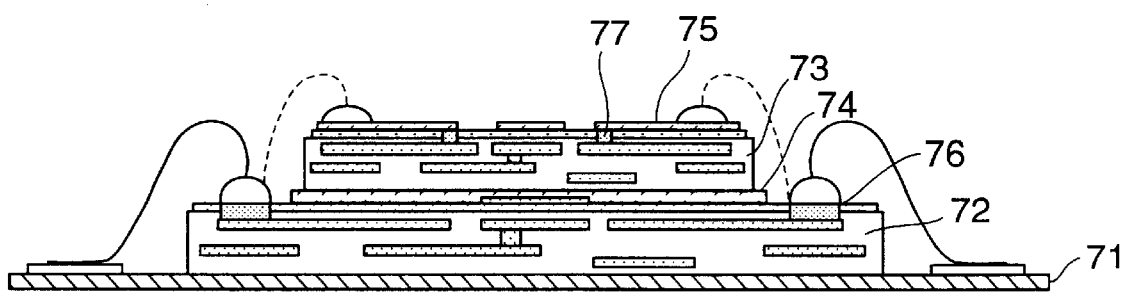

FIG. 7A and FIG. 7B show a third preferred embodiment of the semiconductor device according to the invention. FIG. 7A is a top view of the semiconductor device of the present embodiment. FIG. 7B is a cross-sectional view of the semiconductor device of the present embodiment taken along the one-dot chain line in FIG. 7A.

As shown in FIG. 7A and FIG. 7B, the semiconductor device of the present embodiment includes a main printed wiring board 71, a first semiconductor device 72, and a second semiconductor device 73. In the semiconductor device of the present embodiment, the second semiconductor device 73 is smaller in one-directional length than the first semiconductor device 72 and bonded onto the first semiconductor device 72 by an adhesive agent. An adhesive layer 74 is formed between the first and second semiconductor devices 72 and 73 by this adhesive agent.

In the above-described embodiment of FIG. 7A and FIG. 7B, the first semiconductor device 72 is configured in a structure different from that of the semiconductor device of the first preferred embodiment of the present invention. The first semiconductor device 72 includes a first substrate having a first surface and peripheral portions on the first surface. A first electronic circuit is provided in the first substrate, the first electronic circuit having terminals. A plurality of pads 76 is provided at the peripheral portions of the first substrate, and the pads 76 are connected to the first electronic circuit terminals.

In the above-described embodiment of FIG. 7A and FIG. 7B, the second semiconductor device 73 is configured in a structure that is essentially the same as that of the first preferred embodiment of the present invention. The second semiconductor device 73 includes a second substrate. A second electronic circuit is provided in the second substrate, and the second electronic circuit has terminals. An internal wiring pattern is provided in the second substrate, and the internal wiring pattern is connected to the second electronic circuit terminals. A protective layer is provided on the second substrate, and the protective layer covers the second substrate. A plurality of vias 77 is provided on the second substrate, and the vias 77 project from the protective layer. The vias 77 are connected to the internal wiring pattern at arbitrary positions on the second substrate. An external wiring pattern 75 is provided on the protective layer, and the external wiring pattern 75 is connected to the vias 77 to establish electrical connections between the external wiring pattern 75 and the second electronic circuit terminals. Further, as shown in FIG. 7A and FIG. 7B, the external wiring pattern 75 is connected to the pads 76 of the first semiconductor device 72 by making use of bonding wires.

In the present embodiment, it is possible to provide the enclosure layer, which covers the first and second semiconductor devices 72 and 73, by performing a potting process of a resin material, but this is not shown in FIG. 7A or FIG. 7B.

In the above-described embodiment, the implementation of the two semiconductor devices having different functions onto the main printed wiring board can be achieved with only a nearly one chip area and with the reduced height of the entire semiconductor device. For example, the first semiconductor device 72 may be constituted by a logic LSI device while the second semiconductor device 73 may be constituted by a flash memory device.

Figure 8:
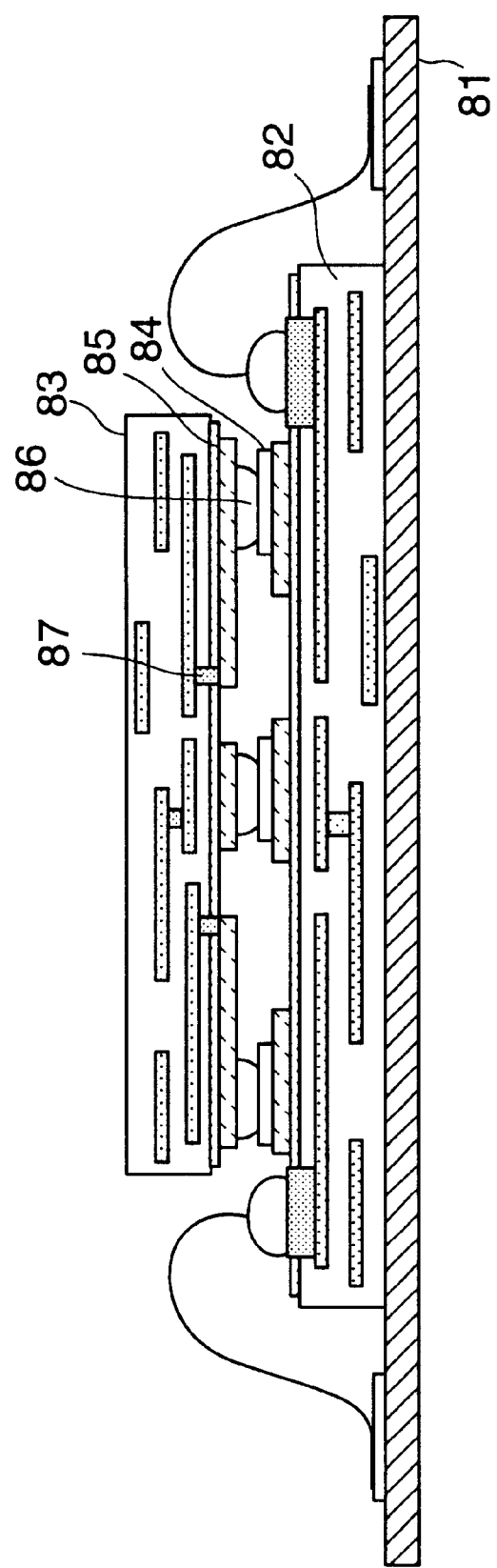
FIG. 8 is a cross-sectional view of a fourth preferred embodiment of the semiconductor device according to the invention.

FIG. 8 shows a fourth preferred embodiment of the semiconductor device according to the invention.

As shown in FIG. 8, the semiconductor device of the present embodiment includes a main printed wiring board 81, a first semiconductor device 82, and a second semiconductor device 83. In the present embodiment, the second semiconductor device 83 is smaller in one-directional length than the first semiconductor device 82, and mounted on the first semiconductor device 82 so that electronic-circuit surfaces of the first and second semiconductor devices 82 and 83 match with each other and electronic circuits of the first and second semiconductor devices 82 and 83 are interconnected by bumps 86. Further, the first and second semiconductor devices 82 and 83 are implemented on the main printed wiring board 81 by using wires.

Each of the first and second semiconductor devices 82 and 83 in the present embodiment includes the elements which are essentially the same as the elements 11, 12, 13, 14 and 15 in the first preferred embodiment of FIG. 1A and FIG. 1B. Similar to the first preferred embodiment, the second semiconductor device 83 includes the vias 87 and the external wiring pattern 85 connected to the vias 87, but does not include the projection electrodes and the enclosure layer. By using the bumps 86, which are made by soldering, the external wiring pattern 85 of the second semiconductor device 83 is connected to the external wiring pattern of the first semiconductor device 82 via a connecting layer 84 of a different conductive material, such as gold (Au). In the present embodiment, the bumps 86 establish electrical connections between the electronic circuits in the first and second semiconductor devices 82 and 83.

In the semiconductor device of the above-described embodiment, projection electrodes are not provided, and the electronic circuits of the first and second semiconductor devices 82 and 83 are interconnected by the bumps 86. The entire height of the semiconductor device in which the first and second semiconductor devices 82 and 83 are implemented on the main printed wiring board 81 can be reduced to a relatively small height. In the present embodiment, it is possible to provide the enclosure layer, which covers the first and second semiconductor devices 82 and 83, by performing a potting process of a resin material, but this is not shown in FIG. 8.

In the above-described embodiment, the implementation of the two semiconductor devices having different functions onto the main printed wiring board can be achieved with only a nearly one chip area and with the reduced height of the entire semiconductor device.

Figure 9:
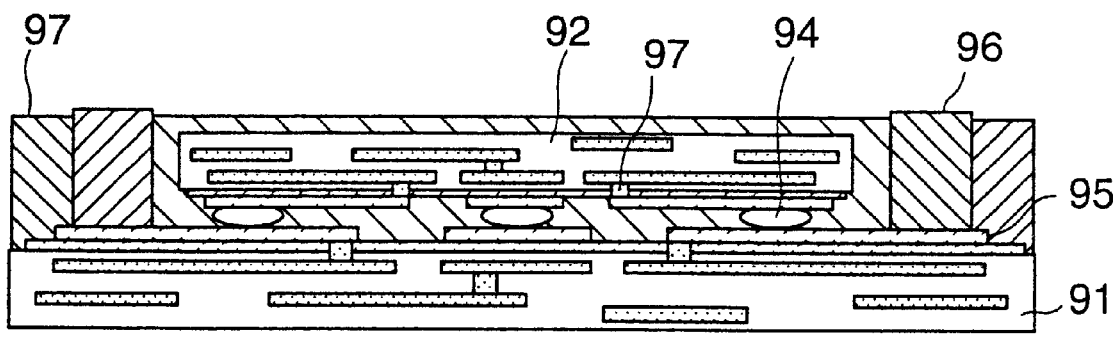
FIG. 9 is a cross-sectional view of a fifth preferred embodiment of the semiconductor device according to the invention.

FIG. 9 shows a fifth preferred embodiment of the semiconductor device according to the invention.

As shown in FIG. 9, the semiconductor device of the present embodiment is essentially the same as the semiconductor device of FIG. 8, but differs from the semiconductor device of FIG. 8 in that projection electrodes 96 are used, instead of the wires, to implement the first and second semiconductor devices on the main printed wiring board.

In the semiconductor device of the present embodiment, as shown in FIG. 9, a first semiconductor device 91 and a second semiconductor device 92 are provided. The second semiconductor device 92 is smaller in one-directional length than the first semiconductor device 91, and mounted on the first semiconductor device 91 so that electronic-circuit surfaces of the first and second semiconductor devices 91 and 92 match with each other and electronic circuits of the first and second semiconductor devices 91 and 92 are interconnected by bumps 94. The second semiconductor device 92 includes the vias 97 and the external wiring pattern connected to the vias 97.

The first semiconductor device 91 includes the projection electrodes 96 provided on the external wiring pattern 95 of the first semiconductor device 91 where the second semiconductor device 92 is not mounted. The projection electrodes 96 are connected to the external wiring pattern 95, the projection electrodes 96 having a predetermined height above the external wiring pattern 95.

The first semiconductor device 91 includes an enclosure layer 97 of a resin material provided on the protective layer of the first semiconductor device 91, the enclosure layer covering sides of the projection electrodes 96 and external surfaces of the external wiring pattern 95 of the first semiconductor device 91.

In producing the semiconductor device of the present embodiment, a wafer on which the intermediate semiconductor devices are prepared after the electronic circuits of the first semiconductor device 91 and the second semiconductor device 92 are interconnected by the bumps 94, is placed into the upper and lower molding dies, and then the compression molding method is carried out to produce the enclosure layer 97 on the protective layer of the first semiconductor device 91 in a manner similar to that of the first preferred embodiment described above.

In the above-described embodiment, the implementation of the two semiconductor devices having different functions onto the main printed wiring board can be achieved with only a nearly one chip area. Further, by providing the enclosure layer, which covers the bumps interposed between the two semiconductor devices, the semiconductor device of the present embodiment is effective in providing reliability of the semiconductor device.

Figure 10A:
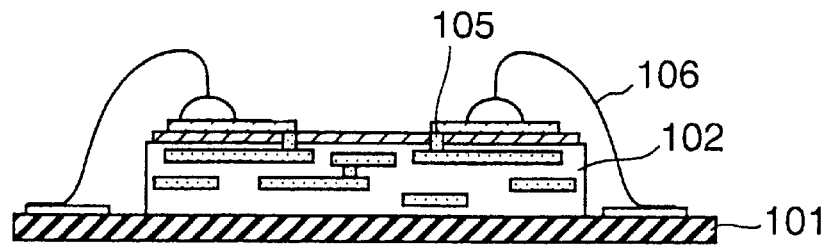
FIG. 10A and FIG. 10B are cross-sectional views of a sixth preferred embodiment of the semiconductor device according to the invention.
Figure 10B:
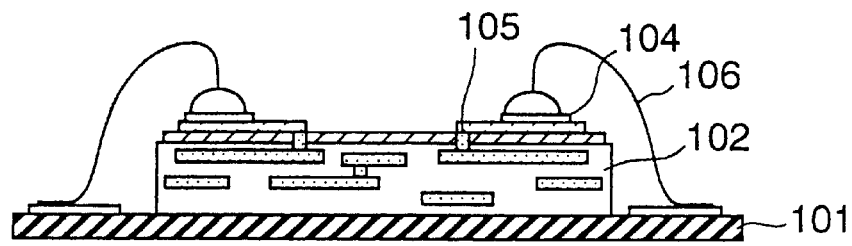
Figure 11:
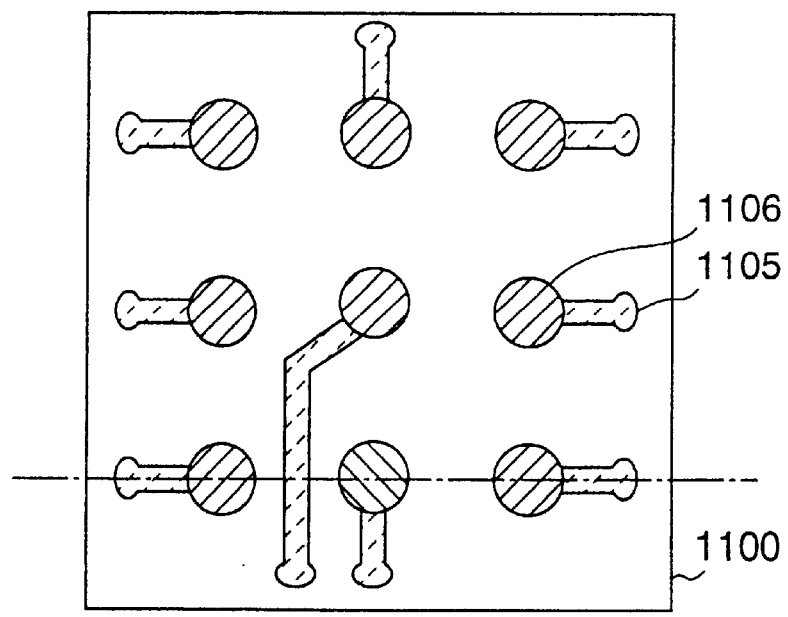
FIG. 11 is a top view of a conventional CSP semiconductor device.
Figure 12:
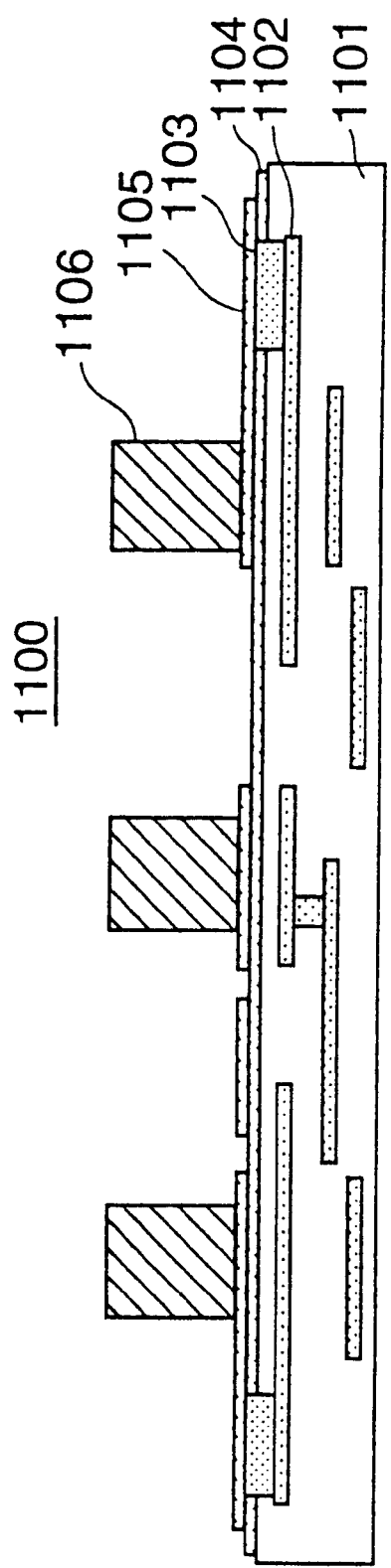
FIG. 12 is a cross-sectional view of the conventional CSP semiconductor device of FIG. 11.

FIG. 10A and FIG. 10B show a sixth preferred embodiment of the semiconductor device according to the invention.

As shown in FIG. 10A and FIG. 10B, the semiconductor device of the present embodiment includes a main printed wiring board 101 and a secondary semiconductor device 102.

In the present embodiment, the secondary semiconductor device 102 includes the elements, which are essentially the same as corresponding elements of the first preferred embodiment of FIG. 1A and FIG. 1B, except for the projection electrodes 16 and enclosure layer 17 in the first preferred embodiment. In the present embodiment, the secondary semiconductor device 102 is implemented on the main printed wiring board 101 by making use of wires 106. The external wiring pattern 105 on the secondary semiconductor device 102 has wire-bonding portions, which are appropriate for use in the wire bonding of the wires 106.

The main printed wiring board 101 includes pads at appropriate positions on the main printed wiring board 101. By performing the wire bonding, the wire-bonding portions of the external wiring pattern 105 of the secondary semiconductor device 102 and the pads of the main printed wiring board 101 are interconnected by the wires 106. The interconnections produced by the wires 106 establish electrical connections between the electronic circuit in the secondary semiconductor device 102 and the electronic circuit in the main printed wiring board 101.

In the interconnections shown in FIG. 10A, the wires 106 extending from the pads of the main printed wiring board 101 are connected directly to the wire-bonding portions of the external wiring pattern 105 of the secondary semiconductor device 102.

In the interconnections shown in FIG. 10B, the wires 106 extending from the pads of the main printed wiring board 101 are connected to the wire-bonding portions of the external wiring pattern 105 of the secondary semiconductor device 102 through a connecting layer 104 of a different conductive material, such as gold.

According to the semiconductor device of the above-described embodiment, the semiconductor device of the present invention can be suitably implemented on the main printed wiring board by utilizing the existing wire bonding equipment. As the semiconductor device of the above-described embodiment does not includes the enclosure layer of the resin material as in the first preferred embodiment, it is not necessary for the present embodiment to utilize a special compression molding equipment for the production of the semiconductor device.

The present invention is not limited to the above-described preferred embodiments, and variations and modifications may be made without departing from the scope of the present invention.

Further, the present invention is based on Japanese priority application No.11-044,919, filed on Feb. 23, 1999, the entire contents of which are hereby incorporated by reference.

What is claimed is:

1. A semiconductor device comprising:
    a semiconductor substrate having a first surface and a second surface, said semiconductor substrate containing an integrated circuit device;
    an electronic circuit provided on the first surface of the substrate, the electronic circuit having terminals;
    an internal wiring pattern provided on the first surface of the substrate, the internal wiring pattern being connected to the electronic circuit terminals;
    a protective layer contacting the first surface of the substrate, the protective layer covering the substrate;
    vias provided on the substrate and projecting from the protective layer, the vias being connected to the internal wiring pattern at arbitrary positions on the substrate;
    an external wiring pattern contacting the protective layer, the external wiring pattern being connected to the vias;
    projection electrodes provided on the external wiring pattern, the projection electrodes being connected to the external wiring pattern to establish connections between the projection electrodes and the electronic circuit terminals, the projection electrodes having a predetermined height above the external wiring pattern; and
    an enclosure layer of a resin material contacting the protective layer, the enclosure layer covering sides of the projection electrodes and external surfaces of the external wiring pattern.

2. The semiconductor device of claim 1, further comprising bumps provided on the projection electrodes, the bumps being connected to the external wiring pattern through the projection electrodes.

3. The semiconductor device of claim 1, wherein the enclosure layer includes a first side surface and the substrate includes a second side surface, the first side surface and the second side surface being formed as a common plane produced by a dicing saw.

4. The semiconductor device of claim 1, wherein the electronic circuit, provided in the substrate, includes as input transistor and an output transistor, the input transistor having an input terminal, the output transistor having an output terminal, and said vias being connected through the internal wiring pattern to one of the input terminal and the output terminal.

5. The semiconductor device of claim 1, wherein the enclosure layer is made of a compression molded resin.

6. The semiconductor device of claim 1, wherein the external wiring pattern is configured with straight-line connections between the vias and the projection electrodes.

7. The semiconductor device of claim 1, wherein each of the vias has a connecting portion at which the via is connected to one of the projection electrodes through the external wiring pattern, the vias having a diameter at the connecting portion that is equal to or smaller than a width of the external wiring pattern.

8. A semiconductor device comprising:
    a semiconductor substrate;
    an electronic circuit provided in the substrate, the electronic circuit having terminals;
    an internal wiring pattern provided in the substrate, the internal wiring pattern being connected to the electronic circuit terminals;
    a protective layer contacting the substrate, the protective layer covering the substrate;
    vias provided on the substrate and projecting from the protective layer, the vias being connected to the internal wiring pattern at arbitrary positions on the substrate;
    an external wiring pattern contacting the protective layer, the external wiring pattern being connected to the vias;
    lead wires connected to the external wiring pattern, the lead wires being supported by a tape; and
    an enclosure layer of a resin material contacting the protective layer, the enclosure layer covering portions of the lead wires and external surfaces of the external wiring pattern.

9. A semiconductor device including a first semiconductor device and a second semiconductor device, in which the second semiconductor device is smaller in one-directional length than the first semiconductor device and bonded onto the first semiconductor device by an adhesive agent,
    the first semiconductor device comprising:
        a first substrate having a first surface and peripheral portions on the first surface;
        a first electronic circuit provided in the first substrate, the first electronic circuit having terminals; and
        pads provided at the peripheral portions of the first substrate, the pads being connected to the first electronic circuit terminals, and
    the second semiconductor device comprising:
        a second substrate;
        a second electronic circuit provided in the second substrate, the second electronic circuit having terminals;
        an internal wiring pattern provided in the second substrate, the internal wiring pattern being connected to the second electronic circuit terminals;
        a protective layer contacting the second substrate, the protective layer covering the second substrate;
        vias provided on the second substrate and projecting from the protective layer, the vias being connected to the internal wiring pattern at arbitrary positions on the second substrate; and
        an external wiring pattern contacting the protective layer, the external wiring pattern being connected to the vias to establish connections between the external wiring pattern and the second electronic circuit terminals, and the external wiring pattern being connected to the pads of the first semiconductor device by wires.

10. A semiconductor device including a first semiconductor device and a second semiconductor device, in which the second semiconductor device is smaller in one-directional length than the first semiconductor device and mounted on the first semiconductor device so that electronic-circuit surfaces of the first and second semiconductor devices match with each other and electronic circuits of the first and second semiconductor devices are interconnected by bumps, each of the first and second semiconductor devices comprising:

a semiconductor substrate;

an electronic circuit provided in the substrate, the electronic circuit having terminals;

an internal wiring pattern provided in the substrate, the internal wiring pattern being connected to the electronic circuit terminals;

a protective layer contacting the substrate, the protective layer covering the substrate;

vias provided on the substrate and projecting from the protective layer, the vias being connected to the internal wiring pattern at arbitrary positions on the substrate; and an external wiring pattern contacting the protective layer, the external wiring pattern being connected to the vias to establish connections between the external wiring pattern and the electronic circuit terminals, and the external wiring pattern being connected to the bumps, wherein the external wiring patterns of the first and second semiconductor devices are interconnected by the bumps.

11. The semiconductor device of claim 10, wherein the first semiconductor device includes:

projection electrodes provided on the external wiring pattern of the first semiconductor device where the second semiconductor device is not mounted, the projection electrodes being connected to said external wiring pattern, the projection electrodes having a predetermined height above said external wiring pattern; and an enclosure layer of a resin material provided on the protective layer of the first semiconductor device, the enclosure layer covering sides of the projection electrodes and external surfaces of said external wiring pattern of the first semiconductor device.

12. A semiconductor device comprising:

a semiconductor substrate having a first surface and a second surface, said semiconductor substrate containing an integrated circuit device;

an electronic circuit provided on the first surface of the substrate, the electronic circuit having terminals;

an internal wiring pattern provided on the first surface of the substrate, the internal wiring pattern being connected to the electronic circuit terminals;

a protective layer contacting the first surface of the substrate, the protective layer covering the substrate;

vias provided on the substrate and projecting from the protective layer, the vias being connected to the internal wiring pattern at arbitrary positions on the substrate; and an external wiring pattern contacting the protective layer, the external wiring pattern being connected to the vias to establish connections between the external wiring pattern and the electronic circuit terminals, and the external wiring pattern including wire-bonding portions which are connected to pads of a printed wiring board by bonding wires.

13. A semiconductor device comprising:

a semiconductor substrate having a first surface and a second surface, said semiconductor substrate containing an integrated circuit device;

an electronic circuit provided on the first surface of the substrate, the electronic circuit having terminals;

a protective layer contacting the first surface of the substrate, the protective layer covering the substrate;

vias provided on the substrate and projecting from the protective layer, the vias being connected to the electronic circuit terminals at arbitrary positions on the substrate;

an external wiring pattern contacting the protective layer, the external wiring pattern having a portion located above each of the vias, and the external wiring pattern being connected to the vias at said portions;

projection electrodes provided on the external wiring pattern, the projection electrodes being connected to the external wiring pattern to establish connections between the projection electrodes and the electronic circuit terminals, the projection electrodes having a predetermined height above the external wiring pattern; and an enclosure layer of a resin material contacting the protective layer, the enclosure layer covering sides of the projection electrodes and external surfaces of the external wiring pattern.

14. A semiconductor device comprising:

a semiconductor substrate having a first surface and a second surface, said semiconductor substrate containing an integrated circuit device;

an electronic circuit provided on the first surface of the substrate, the electronic circuit having terminals;

an internal wiring pattern provided on the first surface of the substrate, the internal wiring pattern being connected to the electronic circuit terminals;

a protective layer contacting the first surface of the substrate, the protective layer covering the substrate;

vias provided directly on the substrate and projecting from the protective layer, the vias being connected to the internal wiring pattern at central positions on the substrate;

an external wiring pattern contacting the protective layer, the external wiring pattern being connected to the vias;

projection electrodes provided on the external wiring pattern, the projection electrodes being connected to the external wiring pattern to establish connections between the projection electrodes and the electronic circuit terminals, the projection electrodes having a predetermined height above the external wiring pattern; and an enclosure layer of a resin material contacting the protective layer, the enclosure layer covering sides of the projection electrodes and external surfaces of the external wiring pattern.

15. A semiconductor device comprising:

a semiconductor substrate;

an electronic circuit provided in the substrate, the electronic circuit having terminals;

an internal wiring pattern provided in the substrate, the internal wiring pattern being connected to the electronic circuit terminals;

a protective layer contacting the substrate, the protective layer covering the substrate;

vias provided directly on the substrate and projecting from the protective layer, the vias being connected to the internal wiring pattern at central positions on the substrate;

an external wiring pattern contacting the protective layer, the external wiring pattern being connected to the vias;

lead wires connected to the external wiring pattern, the lead wires being supported by a tape; and an enclosure layer of a resin material contacting the protective layer, the enclosure layer covering portions of the lead wires and external surfaces of the external wiring pattern.

16. A semiconductor device including a first semiconductor device and a second semiconductor device, in which the second semiconductor device is smaller in one-directional length than the first semiconductor device and bonded onto the first semiconductor device by an adhesive agent, the first semiconductor device comprising:
a first substrate having a first surface and peripheral portions on the first surface;
a first electronic circuit provided in the first substrate, the first electronic circuit having terminals; and
pads provided at the peripheral portions of the first substrate, the pads being connected to the first electronic circuit terminals, and the second semiconductor device comprising:
a second substrate;
a second electronic circuit provided in the second substrate, the second electronic circuit having terminals;
an internal wiring pattern provided in the second substrate, the internal wiring pattern being connected to the second electronic circuit terminals;
a protective layer contacting the second substrate, the protective layer covering the second substrate;
vias provided directly on the second substrate and projecting from the protective layer, the vias being connected to the internal wiring pattern at central positions on the second substrate; and
an external wiring pattern contacting the protective layer, the external wiring pattern being connected to the vias to establish connections between the external wiring pattern and the second electronic circuit terminals, and the external wiring pattern being connected to the pads of the first semiconductor device by wires.

17. A semiconductor device including a first semiconductor device and a second semiconductor device, in which the second semiconductor device is smaller in one-directional length than the first semiconductor device and mounted on the first semiconductor device so that electronic circuit surfaces of the first and second semiconductor devices match with each other and electronic circuits of the first and second semiconductor devices are interconnected by bumps, each of the first and second semiconductor devices comprising:
a semiconductor substrate;
an electronic circuit provided in the substrate, the electronic circuit having terminals;
an internal wiring pattern provided in the substrate, the internal wiring pattern being connected to the electronic circuit terminals;
a protective layer contacting the substrate, the protective layer covering the substrate;
vias provided directly on the substrate and projecting from the protective layer, the vias being connected to the internal wiring pattern at central positions on the substrate; and
an external wiring pattern contacting the protective layer, the external wiring pattern being connected to the vias to establish connections between the external wiring pattern and the electronic circuit terminals, and the external wiring pattern being connected to the bumps,
wherein the external wiring patterns of the first and second semiconductor devices are interconnected by the bumps.

18. A semiconductor device comprising:
a semiconductor substrate having a first surface and a second surface, said semiconductor substrate containing an integrated circuit device;
an electronic circuit provided on the first surface of the substrate, the electronic circuit having terminals;
an internal wiring pattern provided on the first surface of the substrate, the internal wiring pattern being connected to the electronic circuit terminals;
a protective layer contacting the first surface of the substrate, the protective layer covering the substrate;
vias provided directly on the substrate and projecting from the protective layer, the vias being connected to the internal wiring pattern at central positions on the substrate; and
an external wiring pattern contacting the protective layer, the external wiring pattern being connected to the vias to establish connections between the external wiring pattern and the electronic circuit terminals, and the external wiring pattern including wire-bonding portions which are connected to pads of a printed wiring board by bonding wires.

19. A semiconductor device comprising:
a semiconductor substrate having a first surface and a second surface, said semiconductor substrate containing an integrated circuit device;
an electronic circuit provided on the first surface of the substrate, the electronic circuit having terminals;
a protective layer contacting the first surface of the substrate, the protective layer covering the substrate;
vias provided directly on the substrate and projecting from the protective layer, the vias being connected to the electronic circuit terminals at central positions on the substrate;
an external wiring pattern contacting the protective layer, the external wiring pattern having a portion located above each of the vias, and the external wiring pattern being connected to the vias at said portions;
projection electrodes provided on the external wiring pattern, the projection electrodes being connected to the external wiring pattern to establish connections between the projection electrodes and the electronic circuit terminals, the projection electrodes having a predetermined height above the external wiring pattern; and
an enclosure layer of a resin material contacting the protective layer, the enclosure layer covering sides of the projection electrodes and external surfaces of the external wiring pattern.

* * * * *